(12) United States Patent
Okutsu

(10) Patent No.: US 7,697,288 B2
(45) Date of Patent: Apr. 13, 2010

(54) ELECTRONIC APPARATUS

(75) Inventor: Isao Okutsu, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/045,436

(22) Filed: Mar. 10, 2008

(65) Prior Publication Data

US 2008/0253083 A1 Oct. 16, 2008

(30) Foreign Application Priority Data

Apr. 11, 2007 (JP) .............................. 2007-104071

(51) Int. Cl.
*H05K 7/20* (2006.01)
(52) U.S. Cl. ...................... 361/695; 361/700; 165/80.4; 165/104.33; 174/15.2
(58) Field of Classification Search ................. 361/687, 361/695, 697–700, 703–705, 717–719; 174/15.2, 174/16.3; 165/80.3, 80.4, 104.33; 257/714, 257/715, 722
See application file for complete search history.

(56) References Cited

U.S. PATENT DOCUMENTS

| | | | |
|---|---|---|---|
| 6,241,007 B1 * | 6/2001 | Kitahara et al. ............. | 165/80.4 |
| 6,373,700 B1 * | 4/2002 | Wang .......................... | 361/698 |
| 6,407,921 B1 | 6/2002 | Nakamura et al. | |
| 6,442,025 B2 * | 8/2002 | Nakamura et al. ........... | 361/695 |
| 6,650,540 B2 * | 11/2003 | Ishikawa ...................... | 361/695 |
| 6,654,245 B2 * | 11/2003 | Kawashima et al. ........ | 361/695 |
| 6,712,129 B1 * | 3/2004 | Lee ......................... | 165/104.21 |
| 6,717,811 B2 * | 4/2004 | Lo et al. ...................... | 361/698 |
| 6,914,782 B2 * | 7/2005 | Ku .............................. | 361/700 |
| 7,333,340 B2 * | 2/2008 | Zhang et al. ................. | 361/719 |
| 2003/0081382 A1* | 5/2003 | Lin .............................. | 361/697 |
| 2004/0001316 A1* | 1/2004 | Kamikawa et al. .......... | 361/700 |
| 2007/0195500 A1* | 8/2007 | Cheng et al. ................. | 361/697 |

FOREIGN PATENT DOCUMENTS

| | | |
|---|---|---|
| JP | 200144348 | 2/2001 |
| JP | 2005347671 | 12/2005 |

* cited by examiner

*Primary Examiner*—Boris L Chervinsky
(74) *Attorney, Agent, or Firm*—Blakely, Sokoloff, Taylor & Zafman LLP

(57) ABSTRACT

According to one embodiment, an electronic apparatus is provided with a casing, a circuit board contained in the casing, an exothermic body mounted on the circuit board, a cooling fan which is fixed to the inside of the casing and includes a fan case, a heat receiving member which is opposed to the exothermic body and is thermally connected to the exothermic body, and a pressing member opposed to the heat receiving member from the opposite side of the exothermic body. The pressing member is provided to be integral with the fan case. Fixation of the cooling fan to the inside of the casing causes the pressing member to press the heat receiving member against the exothermic body.

20 Claims, 12 Drawing Sheets

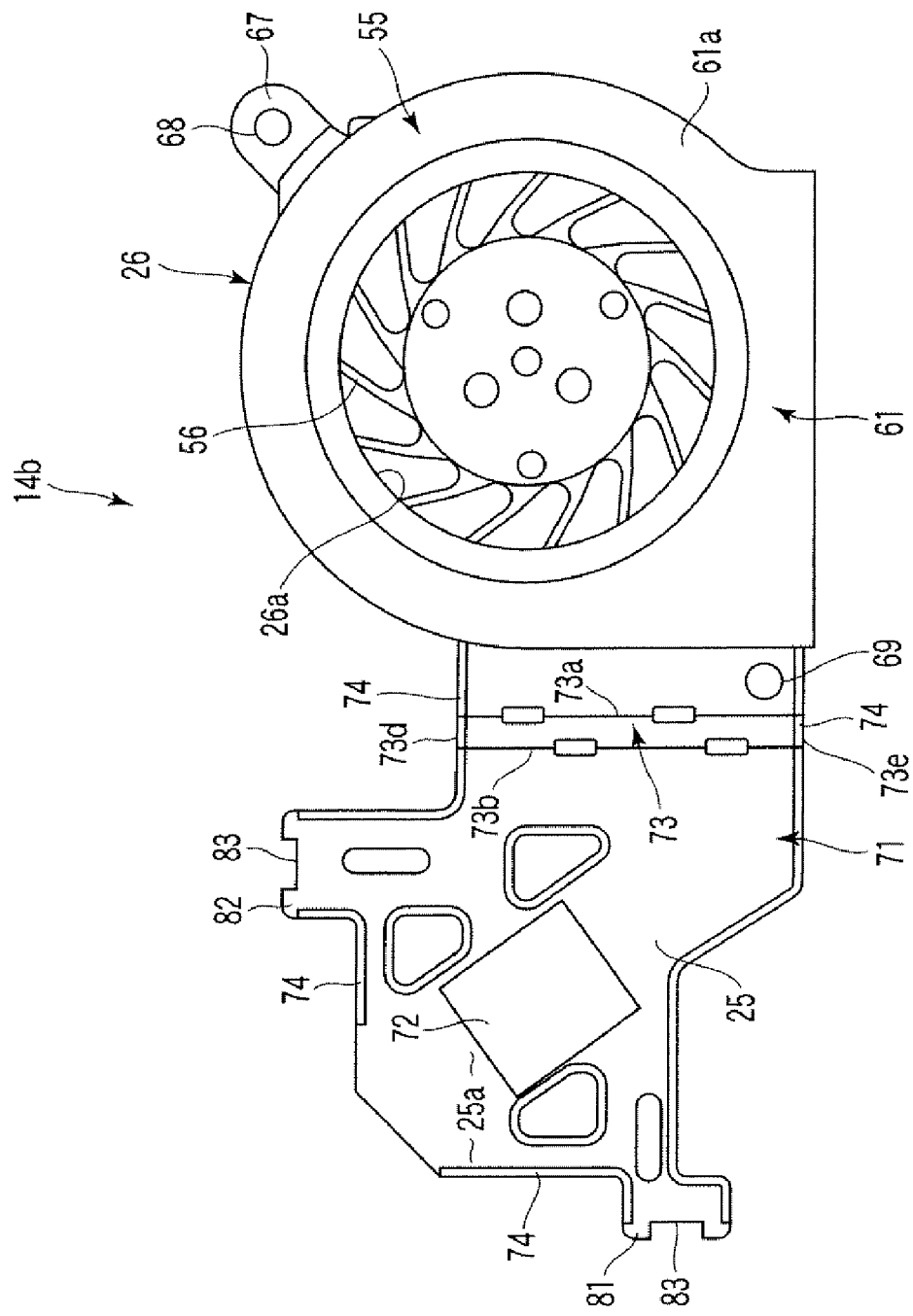
F I G. 4

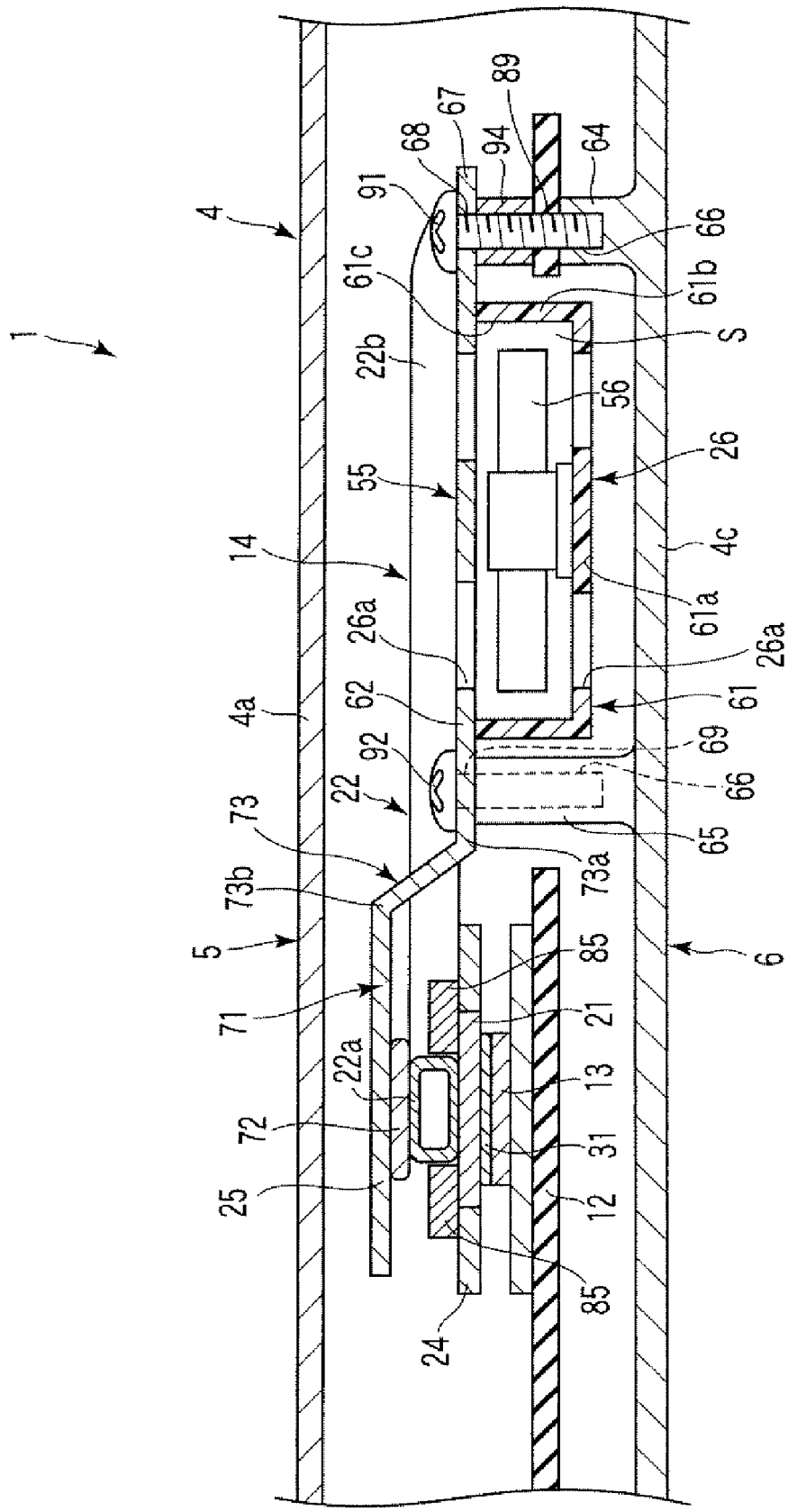
F I G. 6

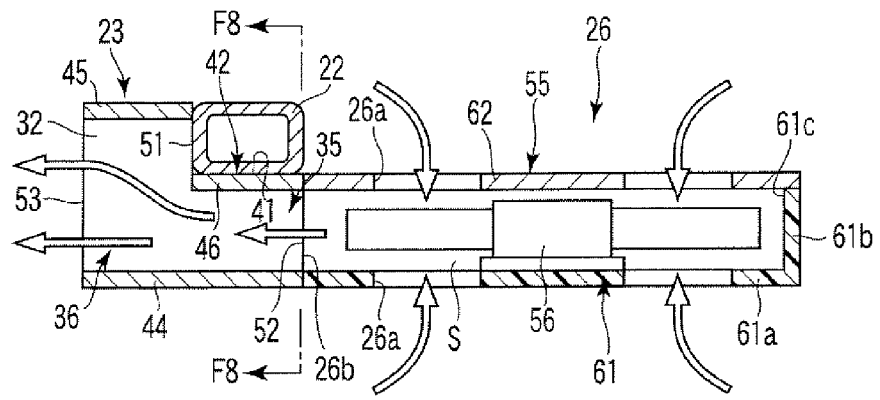
F I G. 7
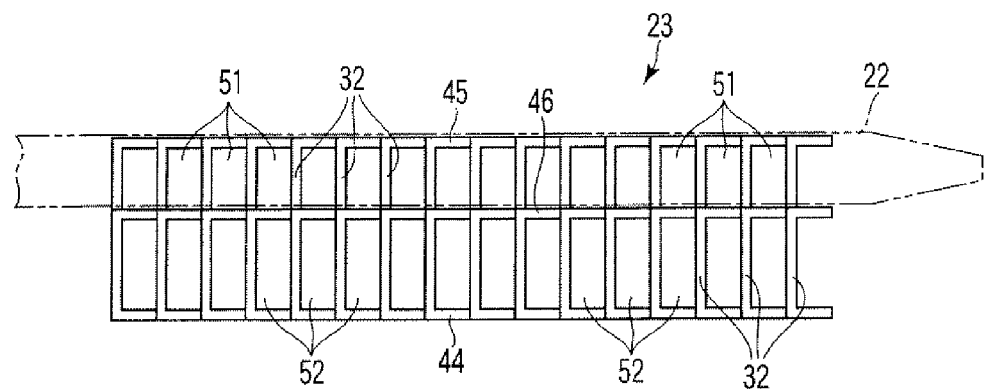
F I G. 8
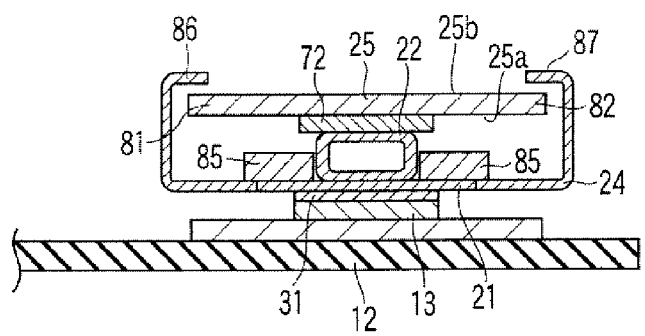
F I G. 9

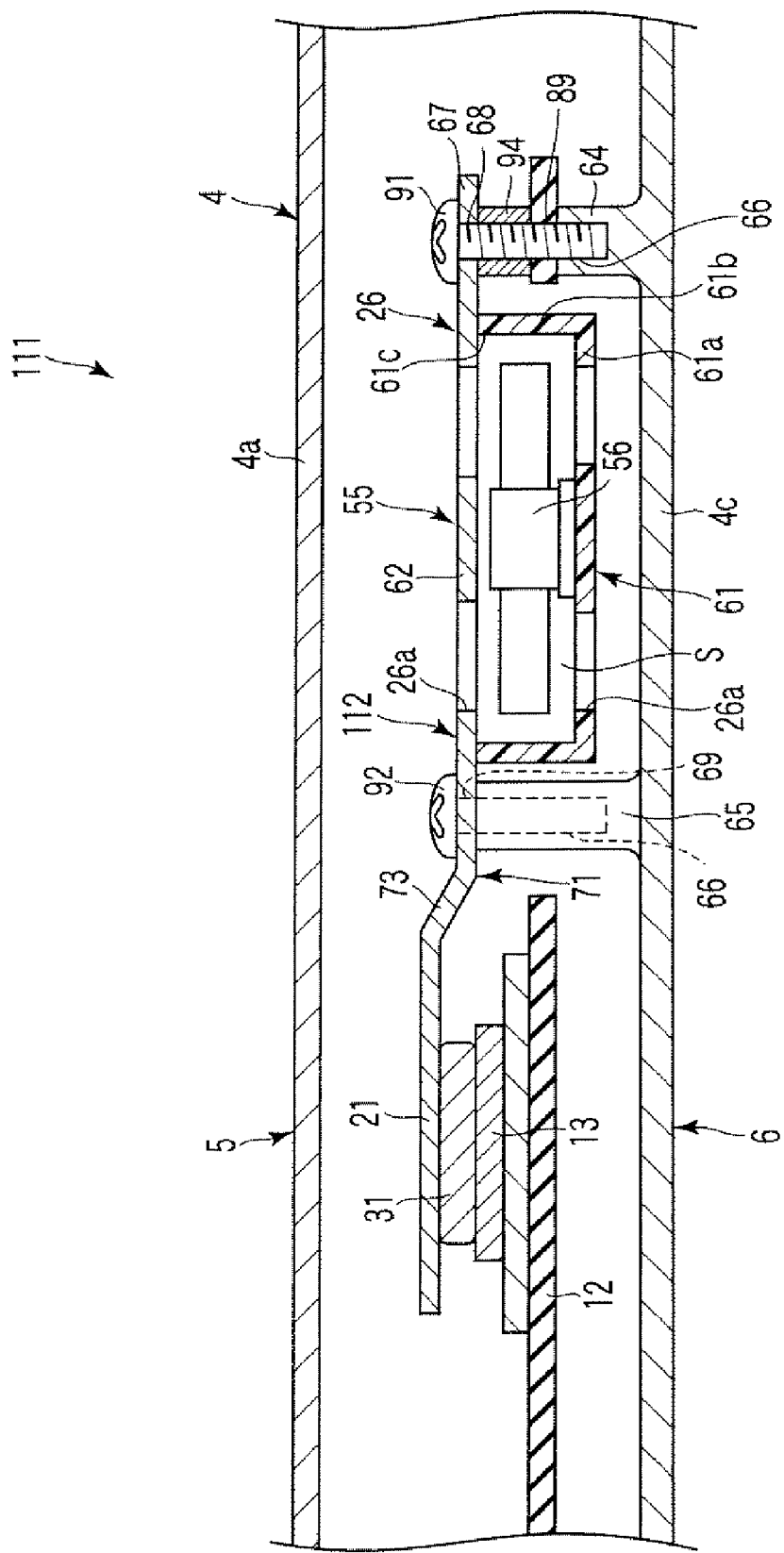
F I G. 12

ELECTRONIC APPARATUS

CROSS-REFERENCE TO RELATED APPLICATIONS

This application is based upon and claims the benefit of priority from Japanese Patent Application No. 2007-104071, filed Apr. 11, 2007, the entire contents of which are incorporated herein by reference.

BACKGROUND

1. Field

One embodiment of the invention relates to an electronic apparatus provided with a cooling fan.

2. Description of the Related Art

In an electronic apparatus such as a portable computer, exothermic bodies such as a CPU and a Northbridge (trade mark) are incorporated. In order to cool such exothermic bodies, an electronic apparatus is provided with a cooling unit.

In Jpn. Pat. Appln. KOKAI Publication No. 2001-44348, a fan device provided with an exothermic body, a heat receiving member, fins, and a fan is disclosed. This fan device includes a plate thermally connected to the heat receiving member, and a cover that is fixed to the plate and forms an air duct between itself and the plate. The fins and the fan are provided in the air duct formed between the cover and the plate. Heat generated from the exothermic body is conducted to the plate through the heat receiving member, and is further conducted to the fins through the plate. The fan cools the fins, whereby cooling of the exothermic body is promoted.

Incidentally, in order to enhance thermal conductivity between the heat receiving member and the exothermic body in a cooling unit such as the above-mentioned fan device, it is conceivable as an idea to attach a pressing member such as a leaf spring to a circuit board to press the heat receiving member against the exothermic body. As a result, it is possible to improve the thermal conductivity between the heat receiving member and the exothermic body, and enhance the cooling capability of the cooling unit. However, if such a pressing member is to be provided, space and a fixing member for fixing the pressing member are required, which is therefore not advantageous to size reduction of the electronic apparatus.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary bottom view showing a cooling fan and a pressing member shown in FIG. 2;

FIG. 6 is an exemplary cross-sectional view of the cooling unit taken along line F6-F6 shown in FIG. 5;

FIG. 7 is an exemplary cross-sectional view showing the cooling fan and a radiator shown in FIG. 2;

FIG. 8 is an exemplary side view of the radiator taken along line F8-F8 shown in FIG. 7;

FIG. 9 is an exemplary cross-sectional view of the cooling unit taken along line F9-F9 shown in FIG. 5;

FIG. 12 is an exemplary cross-sectional view of the cooling unit shown in FIG. 11;

DETAILED DESCRIPTION

Various embodiments according to the invention will be described hereinafter with reference to the accompanying drawings. In general, according to one embodiment of the invention, an electronic apparatus is provided with a casing, a circuit board contained in the casing, an exothermic body mounted on the circuit board, a cooling fan which is fixed to the inside of the casing and includes a fan case, a heat receiving member which is opposed to the exothermic body and is thermally connected to the exothermic body, and a pressing member opposed to the heat receiving member from the opposite side of the exothermic body. The pressing member is provided to be integral with the fan case. Fixation of the cooling fan to the inside of the casing causes the pressing member to press the heat receiving member against the exothermic body.

Embodiments of the present invention will be described below on the basis of drawings in which the present invention is applied to a portable computer.

Figure 1:
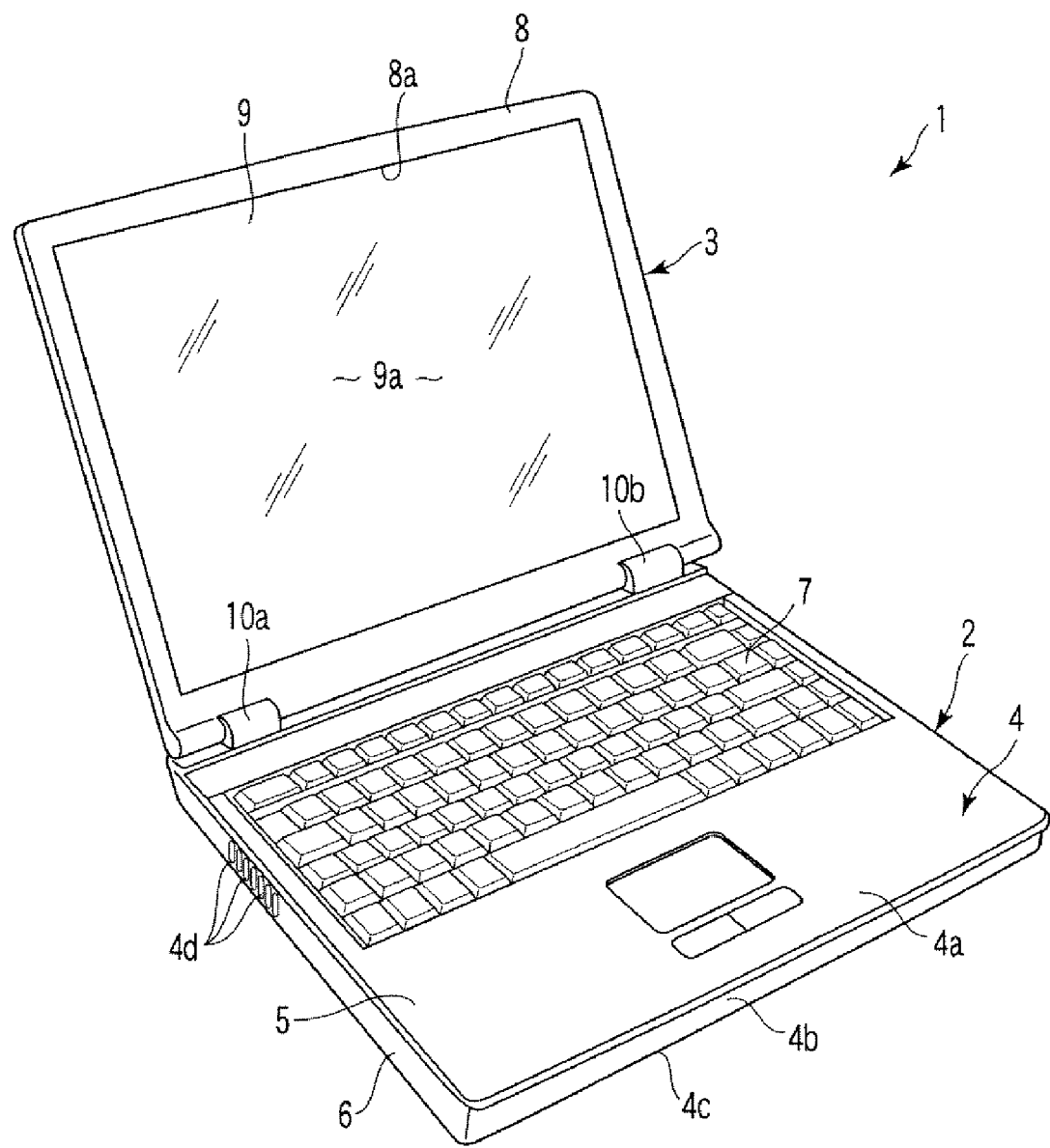
FIG. 1 is an exemplary perspective view of a portable computer according to a first embodiment of the present invention.

FIGS. 1 to 9 disclose a portable computer as an example of the electronic apparatus according to a first embodiment of the present invention. As shown in FIG. 1, a portable computer 1 is provided with a main body 2 and a display unit 3.

The main body 2 includes a casing 4 formed into a box-like shape. The casing 4 includes an upper wall 4a, a peripheral wall 4b, and a lower wall 4c. The casing 4 is provided with a casing cover 5 including the upper wall 4a, and a casing base 6 including the lower wall 4c. The casing cover 5 is combined with the casing base 6 from above, and is detachably supported on the casing base 6. The upper wall 4a supports a keyboard 7. In the peripheral wall 4b, for example, a plurality of exhaust holes 4d are opened.

The display unit 3 is provided with a display housing 8, and a liquid crystal display module 9 contained in the display housing 8. The liquid crystal display module 9 includes a display screen 9a. The display screen 9a is exposed to the outside of the display housing 8 through an opening 8a in the front of the display housing 8.

The display unit 3 is supported on a rear end part of the casing 4 by a pair of hinges 10a and 10b. Thus, the display unit 3 can be turned between a closed position in which the display unit 3 is laid flat to cover the upper wall 4a from above, and an open position in which the display unit 3 is stood to expose the upper wall 4a.

Figure 2:
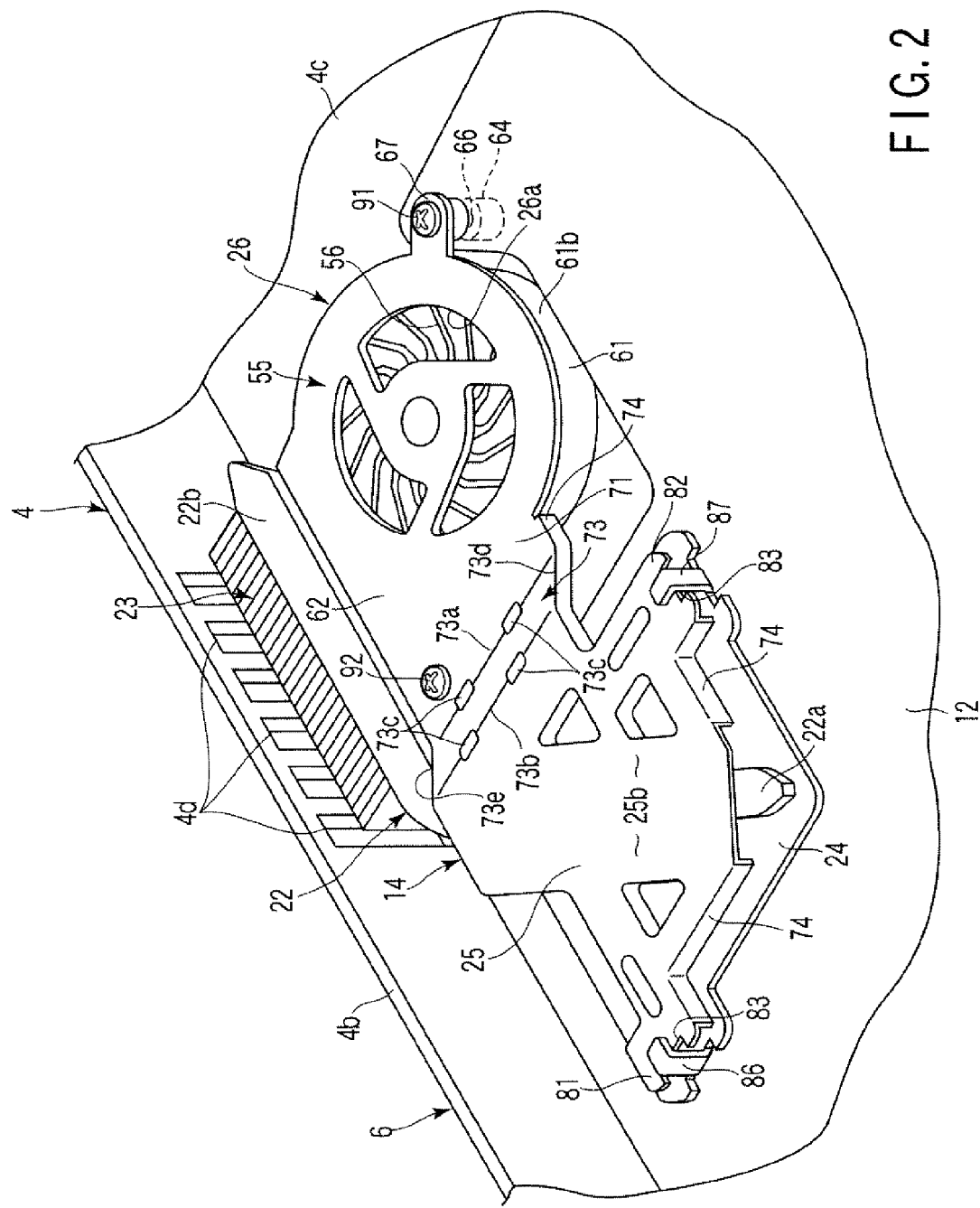
FIG. 2 is an exemplary perspective view of a cooling unit at the first embodiment.
Figure 3:
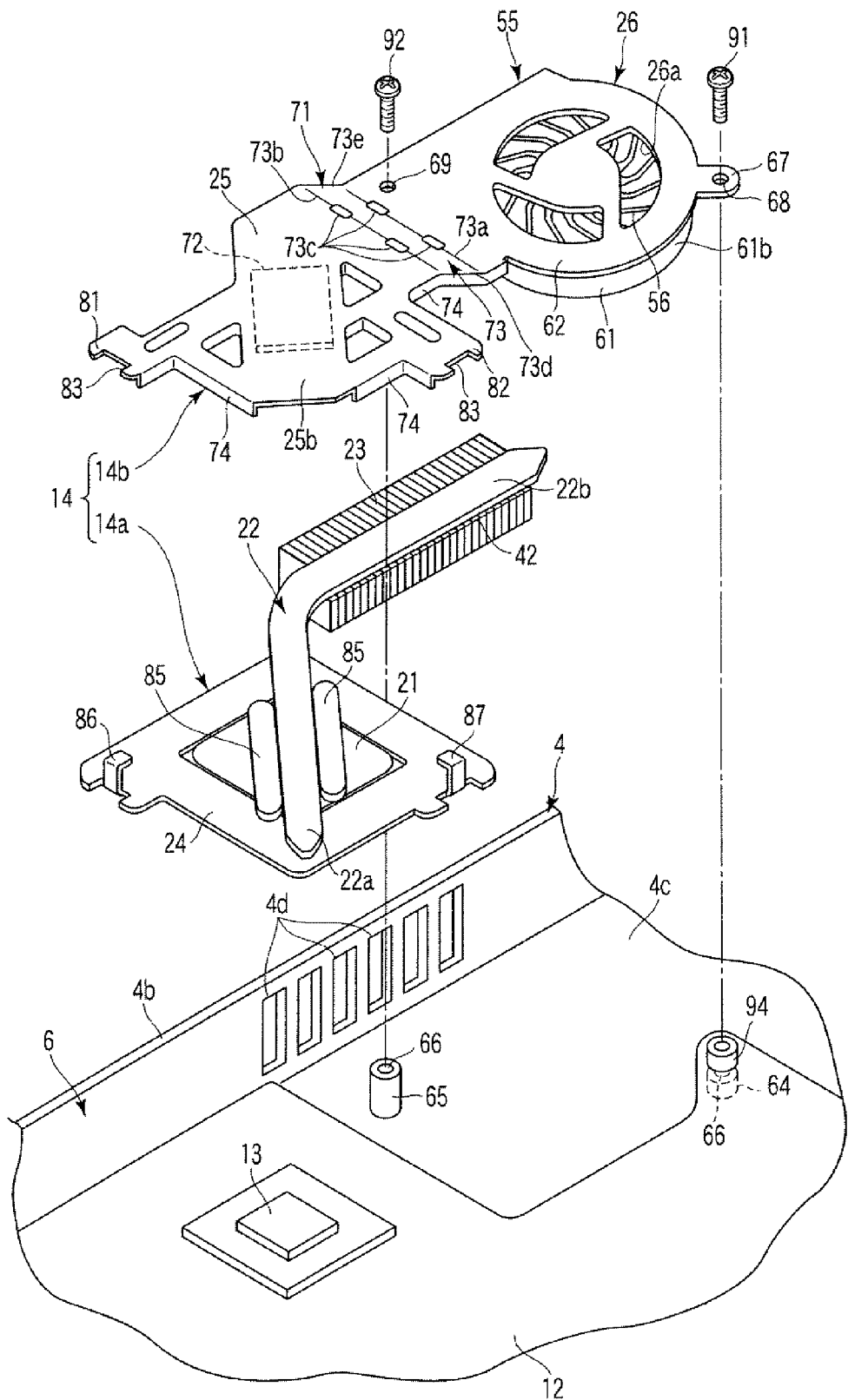
FIG. 3 is an exemplary partially exploded perspective view showing the cooling unit shown in FIG. 2.

As shown in FIGS. 2 and 3, a circuit board 12, an exothermic body 13, and a cooling unit 14 are contained in the casing 4. The exothermic body 13 is mounted on the circuit board 12. Examples of the exothermic body are CPU, a graphic chip, a Northbridge, a memory, and the like. However, the exothermic body is not limited to the above examples, and various components which are mounted on the circuit board, and for which heat radiation is desirable correspond thereto.

As shown in FIG. 3, the cooling unit 14 includes a first unit 14a and a second unit 14b. The first unit 14a includes a heat receiving member 21, a heat transfer member 22, a radiator 23, and a holding member 24. The second unit 14b includes a pressing member 25, and a cooling fan 26.

An example of the heat receiving member 21 is a heat receiving plate made of a copper alloy, for example. The heat receiving member 21 is opposed to the exothermic body 13, and is thermally connected to the exothermic body 13. As shown in FIG. 6, for example, a heat conducting member 31 is provided between the heat receiving member 21 and the exothermic body 13. An example of the heat conducting member 31 is heat conducting grease or a heat conducting sheet. By providing the heat conducting member 31, the thermal connectivity between the heat receiving member 21 and the exothermic body 13 is enhanced.

An example of the heat transfer member 22 is a heat pipe. As shown in FIG. 3, the heat transfer member 22 is provided between the heat receiving member 21 and the radiator 23. The heat transfer member 22 includes a heat receiving end portion 22a thermally connected to the heat receiving member 21, and a heat radiating end portion 22b thermally connected to the radiator 23. As shown in FIG. 6, the heat receiving end portion 22a is arranged between the heat receiving member 21 and the pressing member 25, and is fixed to the heat receiving member 21 by, for example, brazing. The heat transfer member 22 transfers part of heat generated from the exothermic body 13 to the radiator 23.

The radiator 23 is, for example, a fin unit. As shown in FIG. 8, the radiator 23 includes a plurality of fins 32 each of which is formed into a plate-like shape. Incidentally, in FIG. 8, the heat transfer member 22 is indicated by a two-dot chain line for explanation. The fin 32 is a so-called partition plate. The plural fins are juxtaposed with each other. The plural fins 32 are opposed to each other at their surfaces, and are arranged in such a manner that gaps are formed between them. As shown in FIG. 7, the radiator 23 includes an upstream section 35 opposed to the cooling fan 26 and a downstream section 36 opposed to an exhaust hole 4d of the casing 4.

As shown in FIG. 7, the radiator 23 is formed to be thicker than the cooling fan 26 in the direction perpendicular to the discharging direction of the cooling fan 26. Incidentally, the thickness of the radiator 23 is the width thereof in the vertical direction in FIG. 7.

In each of the plural fins 32, a cut-out portion 41 formed by cutting off a part of the fin 32 is formed at the same corner. Each of the fins 32 according to this embodiment includes a cut-out portion 41 at the upper corner part in the upstream section 35. The cut-out portions 41 of the plural fins 32 cooperate with each other in forming a recess 42 which is a region formed by the cut-out portions 41 at the upper corner part in the upstream section 35 of the radiator 23. The recess 42 is provided at a position out of a lateral position of the cooling fan 26 at, for example, an end portion of the radiator 23, the end portion being opposed to the cooling fan 26.

As shown in FIG. 8, upper and lower end portions of each fin 32 are bent toward an adjacent fin 32 at substantially right angles, and are brought into contact with the adjacent fin 32. More specifically, a lower end portion of each of the plural fins 32 is bent, thereby forming a bottom wall 44 of the radiator 23.

Further, an upper end portion in the downstream section 36 of each fin 32 is bent to form a first ceiling wall 45 of the radiator 23. An upper end portion in the upstream section 35 of each fin 32 is bent to form a second ceiling wall 46 of the radiator 23. As shown in FIGS. 7 and 8, the radiator 23 is closed in the vertical direction and the longitudinal direction.

On the other hand, the radiator 23 is opened in the discharging direction (that is, the direction connecting the upstream section 35 and the downstream section 36) of the cooling fan 26. More specifically, between the first ceiling wall 45 and the second ceiling wall 46, first opening portions 51 are opened between the plural fins 32. Likewise, between the second ceiling wall 46 and the bottom wall 44, second opening portions 52 are formed. The second opening portions 52 are opposed to the cooling fan 26. Between the first ceiling wall 45 and the bottom wall 44, third opening portions 53 are formed.

The recess 42 is defined by the second ceiling wall 46 and the first opening portions 51. The recess 42 is provided, for example, throughout the entire length in the longitudinal direction of the radiator 23. The dimensions of the recess can be selectively set in various ways, and an example of the dimensions is substantially the same as the cross-sectional dimensions of the heat transfer member 22.

As shown in FIG. 7, the heat transfer member 22 is arranged in the recess 42. More specifically, the heat transfer member 22 is mounted on the second ceiling wall 46, and is fixed to the second ceiling wall 46. An example of the method of fixing the heat transfer member 22 is soldering, and may be the other method. As shown in FIG. 8, the heat transfer member 22 mounted on the second ceiling wall 46 covers the first opening portions 51 which are opened at a position out of the lateral position of the cooling fan 26.

Incidentally, if a gap between the opening edges of the first opening portions 51 and the heat transfer member 22 is sealed by soldering or the like, the cooling capability of the portable computer 1 is improved. The sealing by using soldering is suitable for a case where a heat transfer member 22 provided with rounded corners such as a heat pipe is used.

As shown in FIG. 6, the cooling fan 26 includes a fan case 55, and an impeller 56 rotatably contained in the fan case 55. The fan case 55 includes a case base 61 and a case cover 62. The case base 61 includes a bottom wall 61a, and a peripheral wall 61b standing from the fringe of the bottom wall 61a, and is formed into a bowl-like shape opened at one end portion thereof. The case cover 62 is combined with the case base 61, and closes an opening portion 61c of the case base 61. As a result, an internal space S in which the impeller 56 is rotated is formed between the case cover 62 and the case base 61. An example of the case base 61 is made of synthetic resin. An example of the case cover 62 is made of metal, and is provided with higher thermal conductivity than the case base 61.

As shown in FIG. 7, the cooling fan 26 includes an inlet port 26a and an exhaust port 26b. The inlet port 26a is opened inside the casing 4. The exhaust port 26b is opposed to the second opening portions 52 of the radiator 23. The cooling fan 26 draws air in the casing 4 through the inlet port 26a, and discharges the drawn-in air from the exhaust port 26b toward the radiator 23. As a result, the cooling fan 26 cools the radiator 23.

As shown in FIGS. 3 and 6, first and second fixing portions 64 and 65 to which the cooling fan 26 is fixed are provided in the casing 4. The first fixing portion 64 is provided in, for example, a region opposed to a part of the circuit board 12. The second fixing portion 65 is provided in, for example, a region apart from the circuit board 12. Incidentally, the first and second fixing portions 64 and 65 may be provided in a region opposed to the circuit board 12, or may be provided in a region apart from the circuit board 12.

Although the number of fixing portions 64 and 65 according to this embodiment is, for example, two, the number is not limited. The first and second fixing portions 64 and 65 are, for example, bosses provided on an inner wall surface of the casing 4. In each of the first and second fixing portions 64 and 65, a threaded hole 66 in which a female thread is formed is opened.

Figure 5:
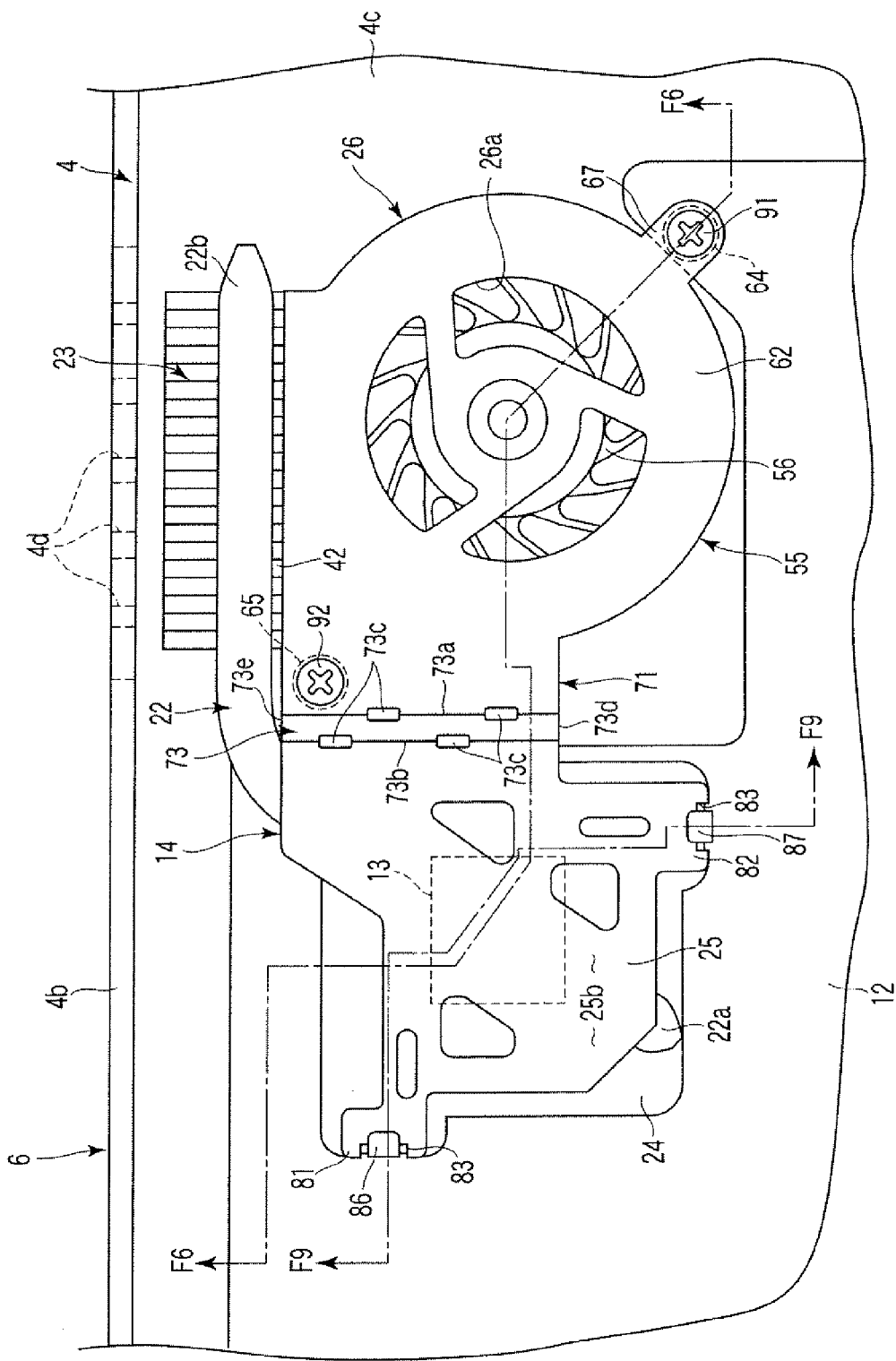
FIG. 5 is an exemplary plan view of the cooling unit shown in FIG. 2.

As shown in FIG. 5, the first and second fixing portions 64 and 65 are provided to be positioned on both sides of the cooling fan 26. The first and second fixing portions 64 and 65 are provided to be separated from each other in a direction intersecting a direction from the exothermic body 13 toward the cooling fan 26.

The case cover 62 includes an overhanging section 67 projecting toward a region opposed to the first fixing portion 64. As shown in FIG. 3, a first screw insertion hole 68 opposed to the first fixing portion 64 is opened in the overhanging section 67. A second screw insertion hole 69 is opened in a region of the case cover 62 opposed to the second fixing portion 65.

As shown in FIGS. 3 and 6, the pressing member 25 is opposed to the heat receiving member 21 and the heat transfer member 22 from the opposite side of the exothermic body 13. The pressing member 25 is provided with a size that covers the heat receiving member 21 and the heat receiving portion 22a of the heat transfer member 22. The pressing member 25 is provided to be integral with the fan case 55. More specifically, the pressing member 25 is provided to be integral with the case cover 62, and is supported by the case cover 62. In other words, it can be said that the pressing member 25 is extended from the case cover 62 toward a region opposed to the heat receiving member 21.

The pressing member 25 and the case cover 62 are formed integral with each other by using, for example, a plate member 71. An example of the plate member 71 is made of metal such as an aluminum alloy, steel, and a magnesium alloy. For example, the aluminum alloy is excellent in thermal conductivity and lightweight properties, and is therefore suitable as a material for the plate member 71.

As shown in FIG. 6, a spacer 72 is arranged between the pressing member 25 and the heat transfer member 22. An example of the spacer 72 is an elastic member such as rubber and sponge. If the spacer 72 is provided with elasticity, when the exothermic body 13 includes an inclination, the heat receiving member 21 and the heat transfer member 22 can incline while following the inclination of the exothermic body 13, thereby increasing the adhesion of the heat receiving member 21 and the exothermic body 13 to each other, and enhancing the thermal connectivity between the heat receiving member 21 and the exothermic body 13.

The spacer 72 according to this embodiment is a heat conducting sheet provided with elasticity and thermal conductivity. Although the spacer 72 is not necessarily provided with thermal conductivity, if the spacer 72 is provided with thermal conductivity, the pressing member 25 is thermally connected to the heat receiving member 21.

As shown in FIG. 6, a bent section 73 formed by bending the plate member 71 is provided between the pressing member 25 and the case cover 62. The bent section 73 includes a first bend 73a and a second bend 73b. The first bend 73a is provided adjacent to the periphery of the case cover 62, and is bent in a direction in which the plate member 71 is separated from the exothermic body 13. The second bend 73b is provided adjacent to the periphery of the pressing member 25, and is bent to allow the pressing member 25 to extend substantially in parallel with the exothermic body 13.

When the bent section 73 is provided between the pressing member 25 and the case cover 62, the arrangement height of the cooling fan 26 can be set irrespective of the arrangement height of the pressing member 25. As shown in FIG. 6, the cooling fan 26 is arranged alongside of the circuit board 12 in, for example, a direction parallel with the board surface of the circuit board 12. As shown in FIG. 2, recesses 73c are provided in each of the first and second bends 73a and 73b of the bent section 73. When the recesses 73c are provided in each of the first and second bends 73a and 73b, the rigidity of the plate member 71 is enhanced, and the retroflexion of the pressing member 25 is suppressed. In the peripheral part of the pressing member 25, a squeezed portion 74 is partly provided. The squeezed portion 74 is formed by bending a peripheral part of the pressing member 25, and improves the strength of the peripheral part. A squeezed portion 74 is also continuously provided at each of both peripheral fringes 73d and 73e of the bent section 73 separate from the case cover 62 and the pressing member 25, thereby improving the strength of the bent section 73.

As shown in FIG. 3, a first engaging portion 81 is provided at a peripheral fringe section of the pressing member 25 which is opposite to the cooling fan 26. A second engaging portion 82 is provided at a peripheral fringe section of the pressing member 25 which is opposite to the radiator 23. Each of the first and second engaging portions 81 and 82 includes a cut-out portion 83 formed by partly cutting off a fringe of the pressing member 25.

The holding member 24 is formed into a frame-like shape surrounding the heat receiving member 21. The holding member 24 is fixed to the heat receiving member 21 through, for example, a fixing member 85, thereby holding the heat receiving member 21. Examples of the holding member 24 and the fixing member 85 are made of metal, such as an aluminum alloy. Incidentally, the holding member 24 may be made of copper alloy together with the heat receiving member 21. However, forming the holding member 24 by using a material a specific gravity of which is small such as an aluminum alloy is more advantageous in weight reduction than the case where the holding member 24 is formed by using a copper alloy.

As shown in FIG. 2, the holding member 24 includes third and fourth engaging portions 86 and 87. Examples of the third and fourth engaging portions 86 and 87 are hooks which extend toward the pressing member 25 and engage with the cut-out portions 83 of the first and second engaging portions 81 and 82 of the pressing member 25. When the third and fourth engaging portions 86 and 87 engage with the first and second engaging portions 81 and 82, the first unit 14a is held by the second unit 14b, thereby integrating the first and second units 14a and 14b with each other. As a result, it becomes possible to handle the first and second units 14a and 14b as one unit.

As shown in FIG. 9, the pressing member 25 includes a first surface 25a opposed to the heat receiving member 21, and a second surface 25b formed on the opposite side of the first surface 25a. For example, a distal end portion of each of the third and fourth engaging portions 86 and 87 formed into a hook shape is opposed to the second surface 25b with a gap held between the distal end portion and the second surface 25b of the pressing member 25. The gap between each of the engaging portions 86 and 87 and the second surface 25b functions as play, which allows the heat receiving member 21, heat transfer member 22, and holding member 24 to incline with respect to the pressing member 25. That is, when the exothermic body 13 includes an inclination, the heat receiving member 21 and the heat transfer member 22 can incline while following the inclination of the exothermic body 13.

As shown in FIG. 5, the circuit board 12 is partly cut off to avoid the interference of the cooling fan 26. In other words, the cooling fan 26 is disposed in a region formed by partly cutting off the circuit board 12, whereby the circuit board 12 and the cooling fan 26 can be juxtaposed with each other in the horizontal direction. The circuit board 12 is fixed to the casing 4 by means of fixing members, such as screws. A part of the circuit board 12 is opposed to the first fixing portion 64 provided in the casing 4. As shown in FIG. 6, in the region of the circuit board 12 opposed to the first fixing portion 64, a screw insertion hole 89 is opened.

As shown in FIG. 3, the portable computer 1 is provided with first and second fixing members 91 and 92 for fixing the cooling fan 26 to the fixing portions 64 and 65. Examples of the first and second fixing members 91 and 92 are screws. The first fixing member 91 is inserted in the first screw insertion hole 68 of the cooling fan 26 and the screw insertion hole 89 of the circuit board 12, and is engaged with the first fixing portion 64. That is, the first fixing member 91 fixes the circuit board 12 together with the cooling fan 26. Incidentally, a stud 94 or the like for height adjustment is provided between the overhanging section 67 of the cooling fan 26 and the circuit board 12 as the need arises. The second fixing member 92 is inserted in the second screw insertion hole 69 of the cooling fan 26, and is engaged with the second fixing portion 65.

The fixation of the cooling fan 26 to the inside of the casing 4 causes the pressing member 25 which is provided to be integral with the fan case 55 to press the heat receiving member 21 against the exothermic body 13. That is, the fixing position of the cooling fan 26 is set in such a manner that when the cooling fan 26 is fixed to the inside of the casing 4, the pressing member 25 is slightly and elastically deformed with respect to the cooling fan 26.

That is, by fixing the cooling fan 26 to the inside of the casing 4 by means of the first and second fixing members 91 and 92, the plate member 71 including the pressing member 25 and the case cover 62 is caused to function as a leaf spring, and pressing force directed to the exothermic body 13 is applied to the heat receiving member 21. An example of the pressing force is, for example, about 0.2 kgf. However, the magnitude of the pressing force is not limited to the above example, and may be a load of such a degree that the heat receiving member 21 does not separate from the exothermic body 13. Further, the pressing member 25 presses the heat receiving end portion 22a of the heat transfer member 22 arranged between the pressing member 25 and the heat receiving member 21 against the exothermic body 13.

Next, the functions of the portable computer 1 will be described below.

The pressing member 25 presses the heat receiving member 21 against the exothermic body 13, and the heat receiving member 21 is firmly thermally connected to the exothermic body 13. As a result, a large part of the heat generated from the exothermic body 13 is received by the heat receiving member 21. Part of the heat transferred to the heat receiving member 21 is radiated from the radiator 23 through the heat transfer member 22.

Further, part of the heat transferred to the heat receiving member 21 is also transferred to the pressing member 25 made of a metal, and is further transferred to the case cover 62 through the pressing member 25. The case cover 62 is exposed to the internal space S in which the impeller 56 is rotated. The heat transferred to the case cover 62 is thermally transferred to air in a region around the impeller 56 in which the wind velocity is high by the driving of the cooling fan 26, and hence the heat is efficiently radiated.

According to the portable computer 1 configured as described above, size reduction can be realized. That is, when the pressing member 25 is provided to be integral with the fan case 55, and the cooling fan 26 is fixed to the inside of the casing 4, the pressing member 25 presses the heat receiving member 21, whereby the pressing member 25 can also be fixed by means of the fixing members 91 and 92 for fixing the cooling fan 26. In other words, it becomes unnecessary to separately provide a spring structure for pressing the heat receiving member 21. Accordingly, it becomes unnecessary to provide a space for fixing the leaf spring for pressing the heat receiving member 21, and a fixing member for the leaf spring. Hence, it is possible to obtain a portable computer 1 which realizes size reduction.

When the cooling fan 26 is fixed to the casing 4, it becomes unnecessary to secure a region for attaching the spring structure on the circuit board 12. That is, it becomes unnecessary to provide bosses and holes for the spring structure on the circuit board 12. As a result, the mounting constraint of the circuit board 12 is relaxed, and size reduction of the circuit board 12 can be realized.

When the pressing member 2S and the case cover 62 of the cooling fan 26 are formed integral with each other by the plate member 71, it is easily possible to provide the pressing member 25 to be integral with the fan case 55 without the need of particular joining or the like. Further, when the pressing member 25 is provided to be integral with the case cover 62 which is fastened by means of the first and second fixing members 91 and 92, it is possible to cause the pressing member 25 to stably exert pressing force by the first and second fixing members 91 and 92.

When the pressing member 25 is made of metal, and is thermally connected to the heat receiving member 21, the heat radiating paths are increased, and part of the heat generated from the exothermic body 13 is radiated through the plate member 71. In other words, the pressing member 25 is one of the heat radiating members. That is, it can be said that in this embodiment, the heat receiving member 21 is pressed by the pressing member 25 serving also as a heat radiating member.

When the fixing portions 64 and 65 to which the cooling fan 26 is fixed are provided to be separated from each other in the direction intersecting the direction from exothermic body 13 toward the cooling fan 26, a line passing the center of the exothermic body 13 and the center of the cooling fan 26 (hereinafter referred to as a center extension line) passes the two fixing portions 64 and 65. When this center extension line passes the two fixing portions 64 and 65, the support for the pressing member 25 is stabilized, and a load can be imposed upon the heat receiving member in a balanced manner.

Incidentally, when three or more fixing portions to which the cooling fan 26 is fixed are provided, if the above-mentioned center extension line passes a part between fixing portions positioned at outermost both ends with respect to the center of the cooling fan 26, the same effect as that described above can be obtained.

When a part of the circuit board is fastened together with the cooling fan 26, the number of the necessary fixing portions in the casing 4 can be further reduced. Further, when the heat transfer member 22 is pressed by the pressing member 25, it becomes unnecessary to separately provide a spring structure for pressing the heat transfer member 22.

In recent years, further reduction in thickness of the portable computer 1 is desired. When the recess 42 is provided in the radiator 23, and the heat transfer member 22 is attached to the recess 42, the mounting height including the radiator 23 and the heat transfer member 22 can be made smaller. That is, the radiator 23 and the heat transfer member 22 can be arranged in a compactly integrating manner, and hence reduction in thickness of the portable computer 1 can be realized. When the recess 42 is provided at the corner of the radiator 23, the heat transfer member 22 can be easily attached to the recess 42.

Further, in recent years, in order to cope with the size reduction trend of the portable computer, a thin type cooling fan 26 is often used. On the other hand, the heat release value of the exothermic body 13 tends to increase. It is considered to increase the fin area of the radiator 23 to enhance the heat radiating capability. When the thickness of the radiator 23 is made greater than that of the cooling fan 26 to secure a large fin area, gaps formed between plural fins are opened in a region out of the lateral position of the cooling fan 26.

If such a radiator 23 is used, there is the possibility that part of the air discharged from the cooling fan 26 flows backward in the radiator 23, and further flows to a region above or below the cooling fan 26 through the opening in the region out of the lateral position of the cooling fan 26. The air once passed the radiator 23 is already warmed, and if the warmed air is returned to the inside of the casing 4, the heat radiating capability is lowered.

On the other hand, in the radiator 23 according to this embodiment, the corner part of the upstream section 35 is cut off to form the recess 42. The heat transfer member 22 is attached to this recess 42, and covers the first opening portions 51. Further, the second opening portions 52 are provided with substantially the same size as the thickness of the cooling fan 26. That is, the heat transfer member 22 closes the first opening portions 51 which are opened at a position out of the lateral position of the cooling fan 26, whereby the air discharged from the cooling fan 26 is exhausted to the outside of the casing from the third opening portions 53 without returning to the inside of the casing 4 through the first or second portions section 51 or 52.

Incidentally, the plate member 71 is not necessarily be made of a metal. The spacer 72 is not necessarily provided with thermal conductivity. When the heat receiving member 21 is provided, the plate member 71 may not be provided with a function as a heat radiating member, and it is sufficient if the plate member 71 is provided with at least a function of pressing the heat receiving member 21.

Figure 10:
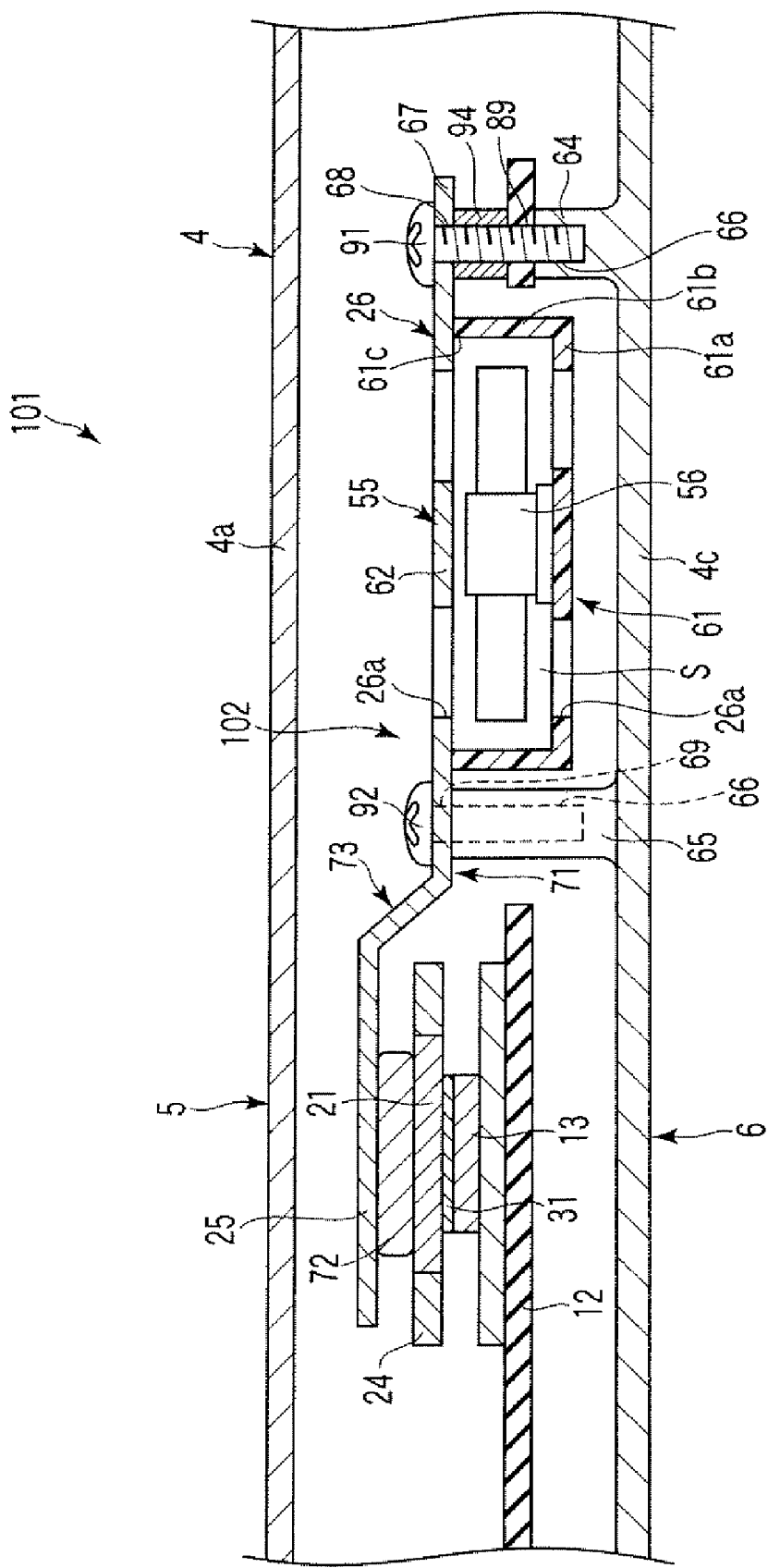
FIG. 10 is an exemplary cross-sectional view of a cooling unit according to a second embodiment of the present invention.

Next, a portable computer 101 as an electronic apparatus according to a second embodiment of the present invention will be described below with reference to FIG. 10. Incidentally, the configuration provided with the same function as that of the portable computer 1 according to the first embodiment will be denoted by the same reference symbols, and a description thereof will be omitted. A cooling unit 102 of the portable computer 101 includes a heat receiving member 21, a holding member 24, a pressing member 25, and a cooling fan 26. In this embodiment, a heat transfer member 22 and a radiator 23 are not provided. The heat receiving member 21 functions as a heat sink.

A large part of heat generated from an exothermic body 13 is conducted to the heat receiving member 21. Part of the heat conducted to the heat receiving member 21 is radiated to the inside of a casing 4 because the heat receiving member 21 functions as a heat sink. Further, part of the heat conducted to the heat receiving member 21 is conducted to the pressing member 25, and then conducted to a case cover 62 through the pressing member 25. The heat conducted to the case cover 62 is thermally conducted to air in a region around an impeller 56 in which the wind velocity is high by the driving of the cooling fan 26, and hence the heat is efficiently radiated.

According to the portable computer 101 configured as described above, size reduction can be realized for the same reason as the first embodiment.

Next, a portable computer 111 as an electronic apparatus according to a third embodiment of the present invention will be described below with reference to FIGS. 11 and 12. Incidentally, the configuration provided with the same function as that of the portable computer 1 according to the first embodiment will be denoted by the same reference symbols, and a description thereof will be omitted. A cooling unit 112 of the portable computer 111 includes a heat receiving member 21, and a cooling fan 26. The cooling fan 26 includes a case base 61 and a case cover 62.

As shown in FIG. 12, the heat receiving member 21 is opposed to an exothermic body 13, and is thermally connected to the exothermic body 13. The heat receiving member 21 provided to be integral with a fan case 55. More specifically, the heat receiving member 21 is provided to be integral with the case cover 62, and is supported by the case cover 62. In other words, it can be said that the heat receiving member 21 is extended from the case cover 62 toward a region opposed to the exothermic body 13.

The heat receiving member 21 and the case cover 62 are formed integral with each other by using, for example, a plate member 71. An example of the plate member 71 is made of metal such as an aluminum alloy, steel, or a magnesium alloy.

As shown in FIG. 12, a heat conducting member 31 is arranged between the heat receiving member 21 and the exothermic body 13. By providing the heat conducting member 31, the thermal connectivity between the heat receiving member 21 and the exothermic body 13 is enhanced. An example of the heat conducting member 31 is a heat conducting sheet or heat conducting grease. If the heat conducting member 31 is provided with elasticity, even when the exothermic body includes an inclination, the heat receiving member 21 is hardly affected by the inclination of the exothermic body 13, and the thermal connectivity between the exothermic body 13 and the heat receiving member 21 is enhanced.

The heat receiving member 21 provided to be integral with the fan case 55 is pressed against the exothermic body 13 by fixing the cooling fan 26 to the inside of the casing 4. That is, the fixing position of the cooling fan 26 is set in such a manner that when the cooling fan 26 is fixed to the inside of the casing 4, the heat receiving member 21 is slightly and elastically deformed.

That is, by fixing the cooling fan 26 to the inside of the casing 4 by means of first and second fixing members 91 and 92, the plate member 71 including the heat receiving member 21 and the case cover 62 is caused to function as a leaf spring, and apply pressing force directed to the exothermic body 13 to the heat receiving member 21.

First and second fixing portions 64 and 65 are provided to be separated from each other in a direction intersecting a direction from the exothermic body 13 toward the cooling fan 26.

Part of the heat generated from the exothermic body 13 is conducted to the heat receiving member 21, and the heat receiving member 21 functions as a heat sink, whereby the heat radiation of the exothermic body 13 is promoted. Further, part of the heat conducted to the heat receiving member 21 is conducted to the case cover 62, and is thermally transferred to air in a region around an impeller 56 in which the wind velocity is high by the driving of the cooling fan 26, whereby the heat is efficiently radiated.

According to the portable computer 111 configured as described above, size reduction can be realized. That is, the heat receiving member 21 is provided to be integral with the fan case 55. The fixation of the cooling fan 26 to the inside of the casing 4 causes the heat receiving member 21 to be pressed against the exothermic body 13, the heat receiving member 21 can also be pressed by the fixing members 91 and 92 for fixing the cooling fan 26. That is, it becomes unnecessary to separately provide a spring structure for pressing the heat receiving member 21, and a portable computer 111 realizing size reduction can be obtained.

When the cooling fan 26 is fixed to the casing 4, it becomes unnecessary to secure a region for attaching the spring structure on a circuit board 12, and hence the mounting constraint of the circuit board 12 is relaxed. When the heat receiving member 21 and the case cover 62 are formed integral with each other by the plate member 71, the heat receiving member 21 can easily be provided to be integral with the fan case 55.

Figure 11:
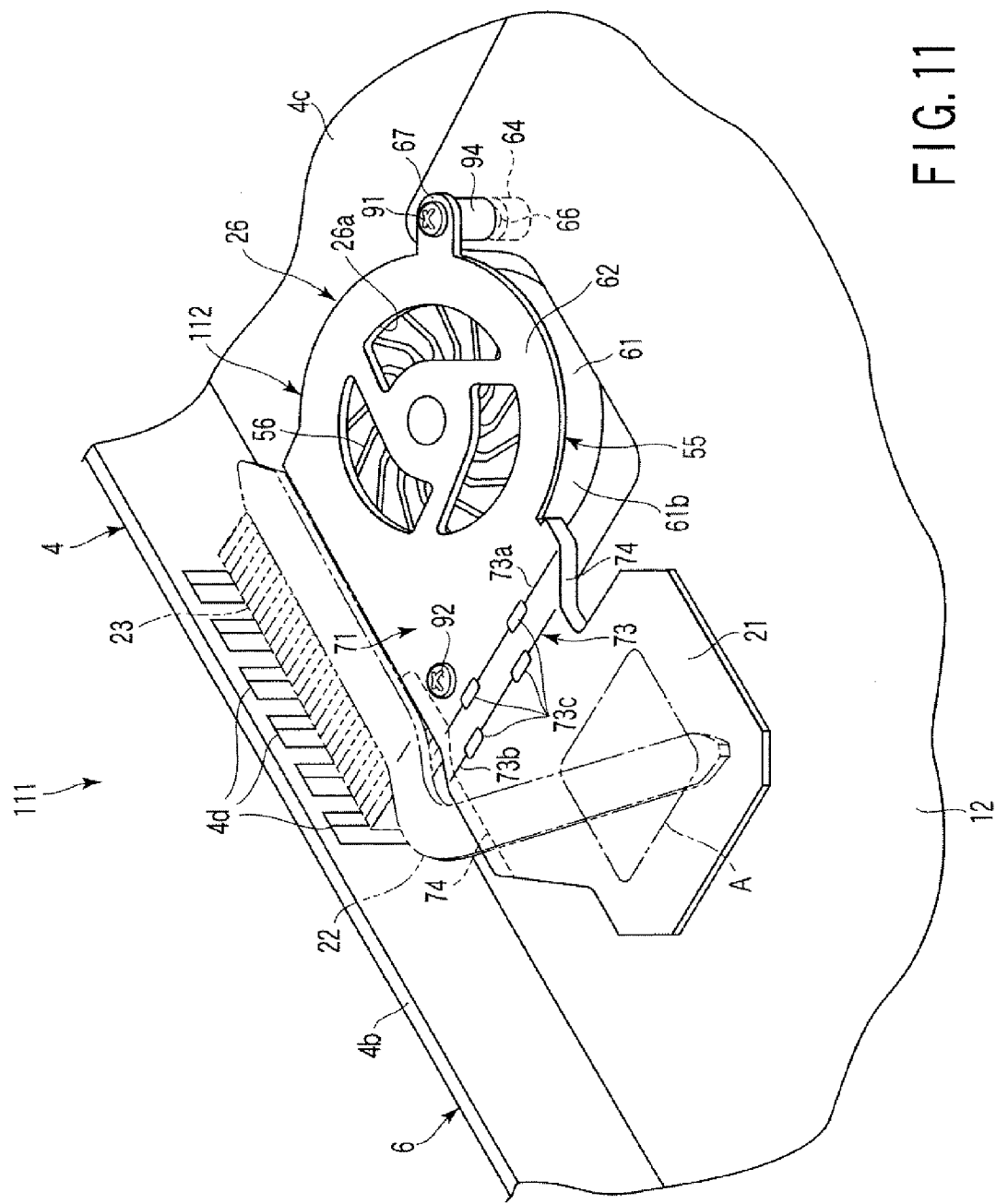
FIG. 11 is an exemplary perspective view of a cooling unit according to a third embodiment of the present invention.

Incidentally, as indicated by a two-dot chain line in FIG. 11, the portable computer 111 may be provided with a heat transfer member 22 and a radiator 23. Further, the expression in the present invention "a thing provided to be integral with the fan case" includes not only a thing formed integral with the fan case 55, but also a thing formed by attaching a separately formed member to the fan case 55, and is treated as an integral body including the fan case 55.

For example, the central part of the heat receiving member 21 surrounded by a chain line in FIG. 11 may be formed by using a copper ally separately from the other part of the heat receiving member 21 and the fan case 55. The case where the separately formed member is supported by the fan case is also included in the expression of the present invention "a thing provided to be integral with the fan case".

Next, modification examples of the radiators according to the first and third embodiments will be described below with reference to FIGS. 13 to 16. Various radiators 23a, 23b, 23c, and 23d to be described below can be appropriately employed in the portable computers 1 and 111 according to the first and third embodiments.

Figure 13:
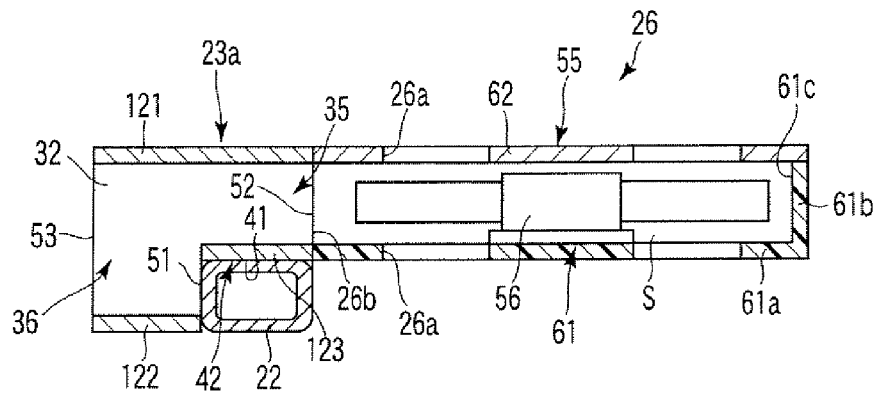
FIG. 13 is an exemplary cross-sectional view of a first modification example of the radiator according to the embodiments of the present invention.

In a radiator 23a shown in FIG. 13, a lower corner part of an upstream section 35 is cut off. More specifically, upper end portions of a plurality of fins 32 are bent, and form a ceiling wall 121 of the radiator 23a.

Lower end portions of a downstream section 36 of the fins 32 are bent, and form a first bottom wall 122 of the radiator 23a. Lower end portions of an upstream section 35 of the fins 32 are bent, and form a second bottom wall 123 of the radiator 23a. The radiator 23a is closed in the vertical and lateral directions.

A recess 42 is formed at a lower corner of the upstream section 35 of the radiator 23a by the cut-off portion of each fin 32. A heat transfer member 22 is arranged in the recess 42, and covers first opening portions 51.

According to the radiator 23a configured as described above, the mounting height including the radiator 23a and the heat transfer member 22 can be prevented from becoming large. Further, air discharged from the cooling fan 26 does not return from the first opening portions 51 to the inside of the casing 4, and hence the heat radiating capability is improved.

Figure 14:
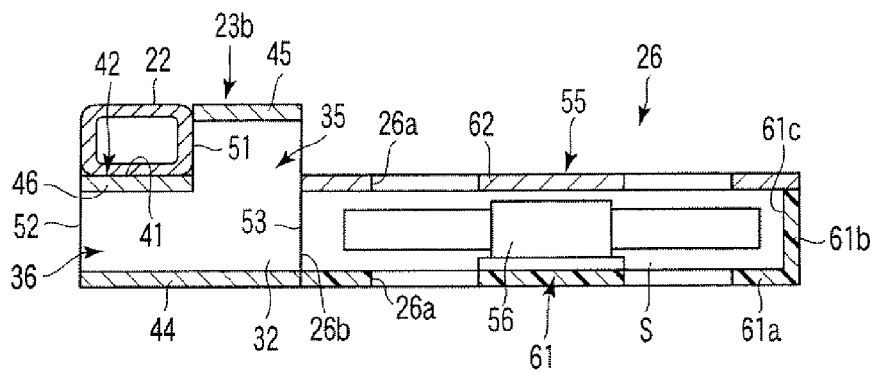
FIG. 14 is an exemplary cross-sectional view of a second modification example of the radiator according to the embodiments of the present invention.
Figure 15:
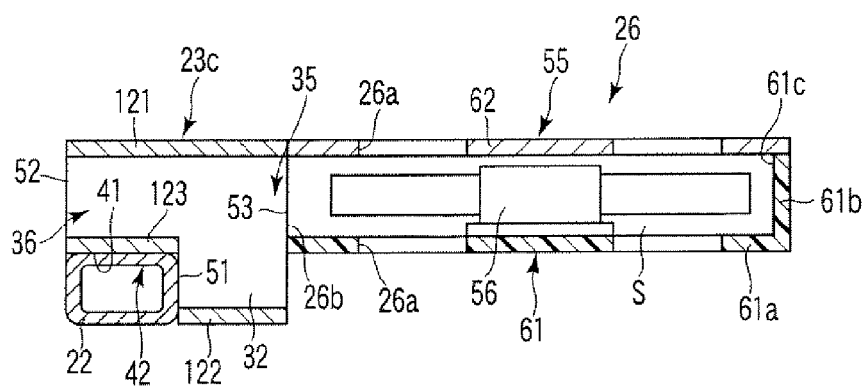
FIG. 15 is an exemplary cross-sectional view of a third modification example of the radiator according to the embodiments of the present invention.

Radiators 23b and 23c in each of which a recess 42 is formed in a downstream section 36 are shown in FIGS. 14 and 15. Incidentally, the configuration provided with the same function as those of the radiators 23 and 23a will be denoted by the same reference symbols, and a description thereof will be omitted.

According to these radiators 23b and 23c, the mounting height including the radiator 23b or 23c and the heat transfer member 22 can be prevented from becoming large.

Figure 16:
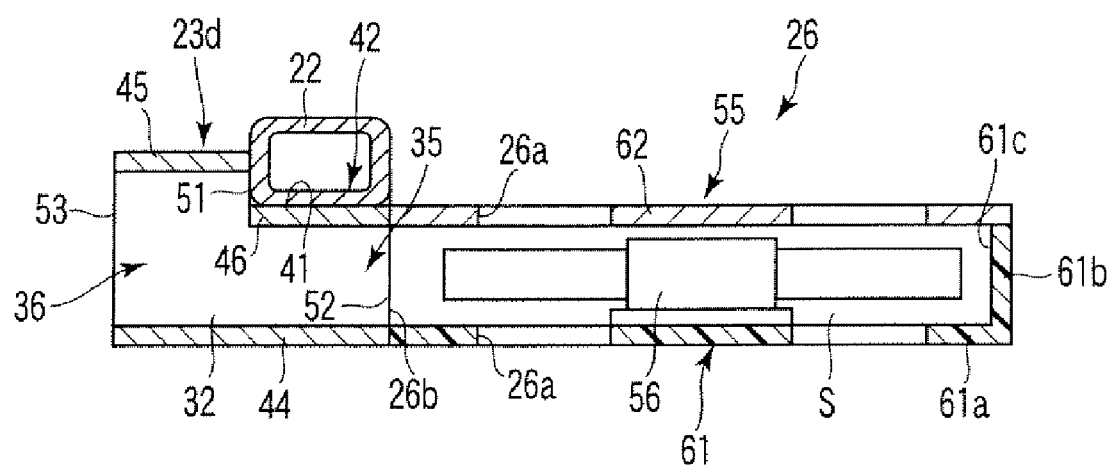
FIG. 16 is an exemplary cross-sectional view of a fourth modification example of the radiator according to the embodiments of the present invention.

Incidentally, although an example of a size of the recesses 42 of the radiators 23, 23a, 23b, and 23c is substantially the same as the cross-sectional size of the heat transfer member 22, the size of the recess 42 is not limited to this. For example, as shown in FIG. 16, even when a part of the heat transfer member 22 attached to the recess 42 protrudes from the radiator 23d, it can be said that the mounting height including the radiator 23d and the heat transfer member 22 can be prevented from becoming large.

When, as an example of the recess 42 that enables the mounting height to be prevented from becoming large, the recess 42 is provided in such a manner that, for example, a center of the heat receiving portion 22a of the heat transfer member 22 is positioned in the recess 42, it can be said that the mounting height including the radiator 23, 23a, 23b, 23c, or 23d and the heat transfer member 22 can be particularly prevented from becoming large.

The portable computers 1, 101, and 111 according to the first to third embodiments have been described above. However, the present invention is not limited to these. Constituent elements according to the first to third embodiments can be appropriately combined with each other to be implemented.

The cooling fan 26 need not necessarily be fixed only to the casing 4, and may be fixed to, for example, the circuit board 12. It is not always necessary that two members are fixed to the first fixing portion 64 together. The cooling fan may be of a so-called side suction type provided with an inlet port 26a in a region opposed to the radiator 23.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a casing;
   a circuit board contained in the casing;
   an exothermic body mounted on the circuit board;
   a cooling fan which is fixed to the inside of the casing, and includes a fan case;
   a heat receiving member which is opposed to the exothermic body, and is thermally connected to the exothermic body; and
   a pressing member opposed to the heat receiving member from the opposite side of the exothermic body, the pressing member is provided to be integral with the fan case and covering a substantial portion of the exothermic body, wherein fixation of the cooling fan to the inside of the casing is to cause the pressing member to press the heat receiving member against the exothermic body.

2. The electronic apparatus according to claim 1, wherein the fan case includes a case base, and a case cover to be combined with the case base, and the case cover and the pressing member are formed integral with each other by a plate member.

3. The electronic apparatus according to claim 2, wherein the plate member is made of metal, and is thermally connected to the exothermic body through the heat receiving member.

4. The electronic apparatus according to claim 1, further comprising:
a radiator cooled by the cooling fan; and
a heat transfer member which is extended from the heat receiving member to the radiator, and transfers part of heat generated from the exothermic body to the 10 radiator, wherein
one end portion of the heat transfer member is arranged between the heat receiving member and the pressing member, and is pressed against the exothermic body by the pressing member.

5. The electronic apparatus according to claim 4, wherein the radiator includes a plurality of fins which are juxtaposed with each other, and in each of which a cut-out portion is formed at the same corner, and
the heat transfer member is arranged in a region formed by the cut-out portions.

6. The electronic apparatus according to claim 5, wherein the radiator is thicker than the cooling fan in a direction perpendicular to a discharging direction of the cooling fan, the region formed by the cut-out portions is provided at a position out of a lateral position of the cooling fan at an end portion of the radiator, the end portion being opposed to the cooling fan, and the heat transfer member covers opening portions formed between the plural fins, the opening portions being opened at a position out of the lateral position of the cooling fan.

7. The electronic apparatus according to claim 1, further comprising a holding member for holding the heat receiving member, wherein
the pressing member includes a first surface opposed to the heat receiving member, and a second surface formed on the opposite side of the first surface, and
the holding member includes hooks which extend toward the pressing member, a distal end portion of each of the hooks is opposed to the second surface of the pressing member with a gap held between the distal end portion and the second surface.

8. The electronic apparatus according to claim 1, further comprising:
a fixing portion which is provided in the casing, and to which the cooling fan is fixed; and
a fixing member for fixing the cooling fan to the fixing portion, wherein
the circuit board is opposed to the fixing portion, and is fixed to the fixing portion together with the cooling fan.

9. An electronic apparatus comprising:
a casing;
a circuit board contained in the casing;
an exothermic body mounted on the circuit board;
a cooling fan which is fixed to the inside of the casing, and includes a fan case;
a heat receiving member which is opposed to the exothermic body, and is thermally connected to the exothermic body;
a pressing member which is opposed to the heat receiving member and covers a substantial portion of both the heat receiving member and the exothermic body, the pressing member being integral to the fan case, wherein
fixation of the cooling fan to the inside of the casing is to cause the heat receiving member to be pressed against the exothermic body.

10. The electronic apparatus according to claim 1, wherein the fan case includes a case cover, the case cover and the pressing member are formed integral with each other by a plate member.

11. The electronic apparatus according to claim 10, wherein the plate member includes a first bend provided adjacent to a periphery of the case cover, and a second bend provided adjacent to a periphery of the pressing member and in a direction to allow the pressing member to extend substantially in parallel with the exothermic body.

12. The electronic apparatus according to claim 11, wherein at least one recess is provided in either the first bend or the second bend, the recess to enhance the rigidity of the plate member.

13. The electronic apparatus according to claim 10, wherein the plate member includes a portion formed at a peripheral part of the pressing member by bending the peripheral part of the pressing member.

14. An electronic apparatus comprising:
a casing;
a circuit board contained in the casing;
an exothermic body mounted on the circuit board;
a cooling fan coupled to an inside of the casing, the cooling fan includes a fan case;
a heat receiving member thermally connected to the exothermic body; and
a pressing member thermally connected to the exothermic body through the heat receiving member interposed between the pressing member and the exothermic body, the pressing member being integral with the fan case, covering a substantial portion of the heat receiving member, and pressing the heat receiving member against the exothermic body upon coupling of the cooling fan to the inside of the casing.

15. The electronic apparatus according to claim 14, wherein the fan case includes a case cover, the case cover and the pressing member are formed integral with each other by a plate member.

16. The electronic apparatus according to claim 15, wherein the plate member is made of metal and is thermally connected to the exothermic body.

17. The electronic apparatus according to claim 14 further comprising a heat transfer member extending from the heat receiving member and transferring at least part of heat generated from the exothermic body, a first end portion of the heat transfer member being arranged between the heat receiving member and the pressing member, and is pressed against the exothermic body by the pressing member.

18. The electronic apparatus according to claim 17 further comprising a radiator coupled to a second end portion of the heat transfer member with the second end portion situated at an opposite end from the first end portion, the radiator includes a plurality of fins which are juxtaposed with each other, and in each of which a cut-out portion is formed at a corner with the heat transfer member being arranged in a region formed by the cut-out portions.

19. The electronic apparatus according to claim 14, wherein the pressing member includes a first surface opposed to the heat receiving member, and a second surface formed on the opposite side of the first surface.

20. The electronic apparatus according to claim 19 further comprising a holding member coupled to the pressing member, the holding member includes hooks which extend toward the pressing member, a distal end portion of each of the hooks is opposed to the second surface of the pressing member with a gap held between the distal end portion and the second surface.

* * * * *